United States Patent
Kitaoka et al.

(10) Patent No.: US 7,227,172 B2
(45) Date of Patent: Jun. 5, 2007

(54) GROUP-III-ELEMENT NITRIDE CRYSTAL SEMICONDUCTOR DEVICE

(75) Inventors: Yasuo Kitaoka, Ibaraki (JP); Hisashi Minemoto, Hirakata (JP); Isao Kidoguchi, Kawanishi (JP); Kazuyoshi Tsukamoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/969,791

(22) Filed: Oct. 19, 2004

(65) Prior Publication Data

US 2005/0082564 A1    Apr. 21, 2005

(30) Foreign Application Priority Data

Oct. 20, 2003  (JP) .............................. 2003-359709
Jun. 25, 2004  (JP) .............................. 2004-188478

(51) Int. Cl.
*C30B 1/00*  (2006.01)
*B32B 9/00*  (2006.01)
*H01L 21/26*  (2006.01)
*H01L 21/42*  (2006.01)
*H01L 21/324*  (2006.01)

(52) U.S. Cl. .................... 257/11; 257/10; 438/796; 438/795; 438/940; 428/210

(58) Field of Classification Search .................. 257/10, 257/11; 438/795, 796; 428/210
See application file for complete search history.

(56) References Cited

U.S. PATENT DOCUMENTS 5,868,837 A    2/1999  DiSalvo et al.
6,121,121 A    9/2000  Koide
6,252,255 B1   6/2001  Ueta et al.
6,270,569 B1   8/2001  Shibata et al.

(Continued)

FOREIGN PATENT DOCUMENTS

JP    2002-293696    10/2002

(Continued)

OTHER PUBLICATIONS

Kawamura, et al., "Growth of a Large GaN Single Crystal Using the Liquid Phase Epitaxy (LPE) Technique", Jpn. J. Appl. Phys., vol. 42, part 2, No. 1A/B, Jan. 15, 2003, pp. L4-L6.

(Continued)

*Primary Examiner*—Kenneth Parker
*Assistant Examiner*—Jesse Fenty
(74) *Attorney, Agent, or Firm*—Hamre, Schumann, Mueller & Larson, P.C.

(57) ABSTRACT

In a Group-III-element nitride semiconductor device including a Group-III-element nitride crystal layer stacked on a Group-III-element nitride crystal substrate, the substrate is produced by allowing nitrogen of nitrogen-containing gas and a Group III element to react with each other to crystallize in a melt (a flux) containing at least one of alkali metal and alkaline-earth metal, and a thin film layer is formed on the substrate and the thin film has a lower diffusion coefficient than that of the substrate with respect to impurities contained in the substrate. The present invention provides a semiconductor device in which alkali metal is prevented from diffusing.

20 Claims, 8 Drawing Sheets

U.S. PATENT DOCUMENTS

| | | | |
|---|---|---|---|
| 6,503,610 B2 * | 1/2003 | Hiramatsu et al. | 428/210 |
| 6,592,663 B1 | 7/2003 | Sarayama et al. | |
| 6,614,059 B1 | 9/2003 | Tsujimura et al. | |
| 6,667,252 B2 * | 12/2003 | Miyajima et al. | 438/796 |
| 2003/0042496 A1 | 3/2003 | Sasaoka | |
| 2004/0124434 A1 | 7/2004 | D'Evelyn et al. | |
| 2004/0144300 A1 | 7/2004 | Kitaoka et al. | |
| 2004/0147096 A1 | 7/2004 | Kitaoka et al. | |
| 2004/0183090 A1 | 9/2004 | Kitaoka et al. | |
| 2004/0262630 A1 | 12/2004 | Kitaoka et al. | |
| 2005/0011432 A1 | 1/2005 | Kitaoka et al. | |
| 2005/0082564 A1 | 4/2005 | Kitaoka et al. | |

FOREIGN PATENT DOCUMENTS

| | | |
|---|---|---|
| JP | 3409576 | 3/2003 |
| JP | 2000-357663 | 12/2003 |
| WO | 2004/013385 | 2/2004 |

OTHER PUBLICATIONS

Kozawa, et al., "Raman scattering from LO phonon-plasmon coupled modes in gallium nitride", Journal of Applied Physics. Jan. 15, 1994, 74(2). 1098-1101—Abstract Only.

M. Morishita. et al. "The growth mechanism of GaN singles crystals in Na flux system", Journal of the Japanese association for crystal growth. vol. 30, No. 3 (2003), 801aA7.

M. Morishita, et al., "Growth of transparent GaN single Crystals using LPE technique in Na flux system", The Japan Society of Applied Physics and Related Societies. Extended Abstracts (The 51st Spring Meeting, 2004), 29 p-YK-6.

* cited by examiner

GROUP-III-ELEMENT NITRIDE CRYSTAL SEMICONDUCTOR DEVICE

BACKGROUND OF THE INVENTION

1. Field of the Invention

The present invention relates generally to a Group-III-element nitride crystal semiconductor device.

2. Related Background Art

A Group-III-element nitride compound semiconductor such as, for instance, gallium nitride (GaN) (hereinafter also referred to as a "Group-III-element nitride semiconductor" or a "GaN-based semiconductor") has been gaining attention as a material for semiconductor elements that emit green, blue or ultraviolet light. A laser diode (LD) that emits blue light is used for high-density optical disk devices or displays while a light emitting diode (LED) that emits blue light is used for displays, lighting, etc. It is expected to use an ultraviolet LD in the field of, for instance, biotechnology and an ultraviolet LED as, for example, an ultraviolet source for a fluorescent lamp.

Usually, substrates made of a Group-III-element nitride semiconductor (for instance, GaN) that are used for LDs or LEDs are formed by heteroepitaxially growing Group-III-element nitride crystals on a sapphire substrate using vapor phase epitaxy. Generally, crystals obtained by this method have a dislocation density of $10^8$ cm$^{-2}$ to $10^9$ cm$^{-2}$. The reduction in dislocation density therefore has been an important issue. In order to resolve this issue, various studies have been made to reduce the dislocation density and for instance, an epitaxial lateral overgrowth (ELOG) method has been developed. With this method, the dislocation density can be reduced to about $10^5$ cm$^{-2}$ to $10^6$ cm$^{-2}$. This method, however, includes complicated processes.

On the other hand, besides the vapor phase epitaxy, a method of growing crystals from a liquid phase also has been studied. However, since the equilibrium vapor pressure of nitrogen is at least 10000 atm ($10000 \times 1.013 \times 10^5$ Pa) at the melting point of Group-III-element nitride single crystals such as GaN or AlN, conditions of 8000 atm ($8000 \times 1.013 \times 10^5$ Pa) at 1200° C. conventionally are required for growing GaN crystals from a liquid phase. Recently, however, it has been confirmed that the use of a Na flux allows GaN crystals to be synthesized at relatively low temperature and pressure, specifically, 750° C. and 50 atm ($50 \times 1.013 \times 10^5$ Pa).

Recently, single crystals whose maximum crystal size is about 1.2 mm are obtained by a method in which a mixture of Ga and Na is melted in a nitrogen gas atmosphere containing ammonia at 800° C. and 50 atm ($50 \times 1.013 \times 10^5$ Pa), and then crystals are grown for 96 hours using the melt (see, for instance, JP2002-293696A).

Furthermore, another method has been reported in which a GaN crystal layer is formed on a sapphire substrate by a metalorganic chemical vapor deposition (MOCVD) method and then single crystals are grown by a liquid phase epitaxy (LPE) method.

In the LPE method by which nitride crystals are grown using at least one of alkali metal and alkaline-earth metal as a flux, however, the introduction of impurities is a problem since it may change, for instance, the carrier density. In addition, the alkali metal and alkaline-earth metal to be used as a flux are elements that are particularly susceptible to the introduction of impurities in the semiconductor processes.

SUMMARY OF THE INVENTION

Hence, with such situations in mind, the present invention is intended to provide a technique for preventing impurities from diffusing in a semiconductor device produced using a substrate that is obtained by growing Group-III-element nitride crystals in a flux that is at least one of alkali metal and alkaline-earth metal.

In order to achieve the above-mentioned object, a Group-III-element nitride crystal semiconductor device of the present invention is a semiconductor device including a Group-III-element nitride crystal layer stacked on a Group-III-element nitride crystal substrate. In the semiconductor device, the substrate is produced by allowing nitrogen of nitrogen-containing gas and a Group III element to react with each other to crystallize in a melt (a flux) containing at least one of alkali metal and alkaline-earth metal. The semiconductor device includes a thin film layer formed on the substrate, and the thin film layer has a lower diffusion coefficient than that of the substrate with respect to impurities contained in the substrate.

In the semiconductor device of the present invention, since the thin film layer is formed on the Group-III-element nitride crystal substrate and has a lower diffusion coefficient than that of the substrate with respect to impurities contained in the substrate, the impurities contained in the substrate can be prevented from diffusing into the Group-III-element nitride crystal layer.

DETAILED DESCRIPTION OF THE INVENTION

Figure 1A:
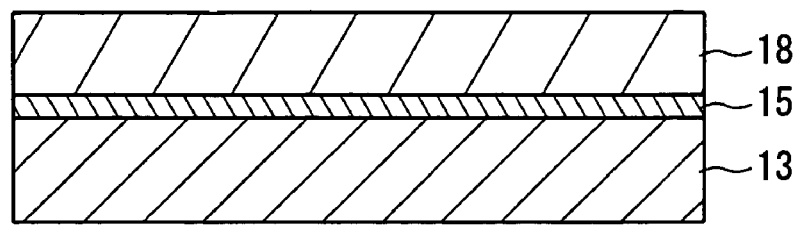
FIGS. 1A to 1C are cross-sectional views showing an example of the configuration of a semiconductor device according to the present invention.

When, for example, threading dislocations (for instance, screw dislocations or edge dislocations) or lattice defects are present in a part of crystals obtained by growing Group-III-element nitride crystals in a flux containing at least one of alkali metal and alkaline-earth metal, the alkali metal or the alkaline-earth metal may be introduced into that part. The present invention is characterized in that the alkali metal or alkaline-earth metal that has been introduced into that part can be prevented from diffusing. In this connection, the alkali metal and alkaline-earth metal, specifically, Na and Li may be introduced into the threading dislocation or lattice defect regions present in the crystals and then may diffuse. This introduction can be confirmed by, for instance, secondary ion mass spectroscopy (SIMS). Furthermore, cathode luminescence caused when the substrate was irradiated with electron rays was observed and dark spots obtained thereby were considered as dislocations.

In the present invention, the Group-III-element nitride crystal substrate is not particularly limited as long as it is produced by allowing nitrogen of nitrogen-containing gas and a Group III element to react with each other to crystallize in a melt (a flux) containing at least one of alkali metal and alkaline-earth metal. For instance, a substrate obtained by slicing large Group-III-element nitride crystals grown in bulk in the melt may be used.

Examples of the alkali metal include Na, Li, K, Rb, Cs, and Fr while examples of the alkaline-earth metal include Ca, Mg, Sr, Be, and Ba. They may be used individually, or two or more of them may be used together. Among them, Na, Li, Ca, and Mg are preferable. Particularly, the use of both Na and Li or the use of Na or Li alone is preferable. When the substrate is, for instance, a GaN substrate, the use of both Na and Li is preferable. On the other hand, when the substrate is an AlN substrate, the use of both Ca and one selected from Li, Na, and Sn is preferable. Furthermore, the melt may include another metal as a flux component in addition to the alkali metal or alkaline-earth metal. Examples of the metal include Sn.

Examples of the Group III element include Ga, Al, and In. Among them, Ga and Al are preferable. It is preferable that the substrate has a composition that is expressed by a formula of $Al_uGa_vIn_{1-u-v}N$ (where $0 \leq u \leq 1$, $0 \leq v \leq 1$, and $u+v \leq 1$). Moreover, preferably, the Group III element is Ga and the substrate is formed of GaN, or the Group III element is Al and the substrate is formed of AlN.

The substrate may be one obtained by growing Group-III-element nitride crystals on a support substrate that has been prepared beforehand. In this case, it is preferable that a seed layer is formed on the support substrate and the seed layer is formed of crystals having the same composition as that of the Group-III-element nitride crystal substrate. Preferably, the support substrate is one selected from the group consisting of a GaAs substrate whose surface is a (111) plane, a Si substrate whose surface is a (111) plane, a sapphire substrate whose surface is a (0001) plane, and a SiC substrate whose surface is a (0001) plane.

In the present invention, examples of the impurities that are contained in the substrate include alkali metal or alkaline-earth metal that is a flux component, and impurities that originate from materials of the crucible, reactor vessel, or other members used for producing the crystals. Examples of the alkali metal include Na, Li, K, Rb, Cs, and Fr while examples of the alkaline-earth metal include Ca, Mg, Sr, Be, and Ba. Particularly, the introduction of, for instance, Na, Li, Ca, or Mg into the substrate may have a great effect on, for instance, the carrier density of the Group-III-element nitride crystal layer.

In the present invention, it is advantageous that the thin film layer has a lower diffusion coefficient than that of the substrate with respect to the impurities contained in the substrate. Preferably, the diffusion coefficient of the thin film layer is lower than that of the substrate by, for example, at least an order of magnitude. In addition, the diffusion coefficient of the thin film layer with respect to the impurities contained in the substrate at 1000° C. is preferably, for instance, $1 \times 10^{-16}$ cm²/sec or lower, and more preferably $1 \times 10^{-17}$ cm²/sec or lower. The impurity diffusion coefficient can be evaluated by the SIMS. The evaluation method carried out by the SIMS is as follows, for example. That is, after impurities contained in the substrate are analyzed by the SIMS, ions are implanted in the substrate surface through ion implantation, a heat treatment then is carried out at a predetermined temperature, impurities contained in the substrate are analyzed by the SIMS and then a profile of the impurities is produced based on the results of the SIMS analyses made before and after the treatment. Thus the impurity diffusion coefficient can be determined.

Examples of the thin film layer include those made of silicon nitride (SiN), aluminum nitride (AlN), aluminum gallium nitride ($Al_xGa_{1-x}N$ (where $0 \leq x \leq 1$)), silicon carbide (SiC), germanium nitride ($GeN_2$), diamond-like carbon, and diamond. Among them, silicon nitride, aluminum gallium nitride, and aluminum nitride are preferable, and aluminum gallium nitride is more preferable. When a Group-III-element nitride crystal substrate formed from bulk crystals is used as the substrate, it is preferable that the thin film layer is made of aluminum nitride.

When the substrate is, for example, a GaN substrate, it is preferable that the thin film layer is made of at least one of silicon nitride (SiN), aluminum nitride (AlN), aluminum gallium nitride ($Al_xGa_{1-x}N$ (where $0 \leq x \leq 1$)), and silicon carbide (SiC), more preferably aluminum gallium nitride or aluminum nitride, and particularly preferably aluminum gallium nitride. Furthermore, when the substrate is, for instance, an AlN substrate, it is preferable that the thin film layer is made of diamond.

The thickness of the thin film layer is not particularly limited but may be, for example, 1 nm to 1000 nm, preferably 5 nm to 100 nm, and more preferably 10 nm to 50 nm. When the thin film layer is made of silicon nitride, its thickness is preferably 5 nm or less, more preferably 3 nm or less. When the thickness is 5 nm or less, the thin film layer does not hinder the Group-III-element nitride crystals from growing on the thin film layer.

The method of forming the thin film layer is not particularly limited and can be decided suitably according to the material to be used for its formation. Examples of the method include an electron cyclotron resonance (ECR) sputter method and the MOCVD method. For instance, in the case of forming a silicon nitride layer, it is preferable that the ECR sputter method is used to form it. On the other hand, in the case of forming an aluminum nitride layer, it is preferable that the low pressure MOCVD method is used to form it.

Preferably, the crystal layer has a composition that is expressed by a formula of $Al_uGa_vIn_{1-u-v}N$ (where $0 \leq u \leq 1$, $0 \leq v \leq 1$, and $u+v \leq 1$). It is preferable that the crystal layer is formed by the vapor phase epitaxy method such as, for example, the MOCVD method.

The configuration of the semiconductor device according to the present invention is described below with reference to FIGS. 1A to 1C as an example.

As shown in FIG. 1A, in the semiconductor device of the present invention, it is preferable that a thin film layer 15 and a Group-III-element nitride crystal layer 18 are formed sequentially on a Group-III-element nitride crystal substrate 13 and the thin film layer 15 is formed on the whole surface of the substrate 13.

Figure 1B:
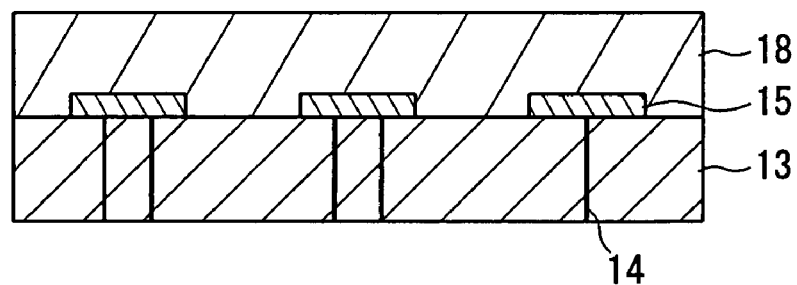

As shown in FIG. 1B, when threading dislocations 14 are present in the Group-III-element nitride crystal substrate 13, the thin film layer 15 may be formed on the regions where the threading dislocations 14 are present. As described earlier, impurities may be present in the regions of the threading dislocations. Hence, the thin film layer 15 formed on the regions can prevent the impurities contained in the substrate 13 from diffusing into the Group-III-element nitride crystal layer 18 satisfactorily.

Figure 1C:
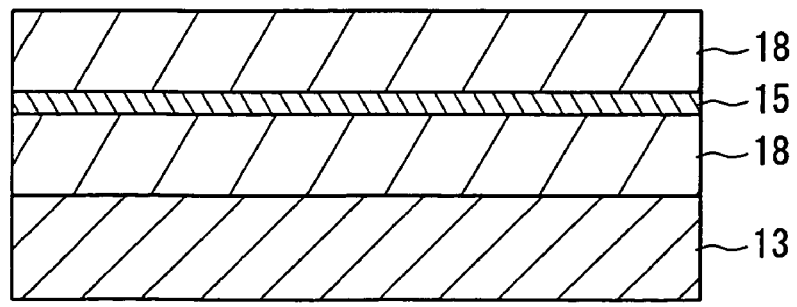

As shown in FIG. 1C, the semiconductor device of the present invention further may include another Group-III-element nitride crystal layer 18 formed between the Group-III-element nitride crystal substrate 13 and the thin film layer 15.

Figure 9A:
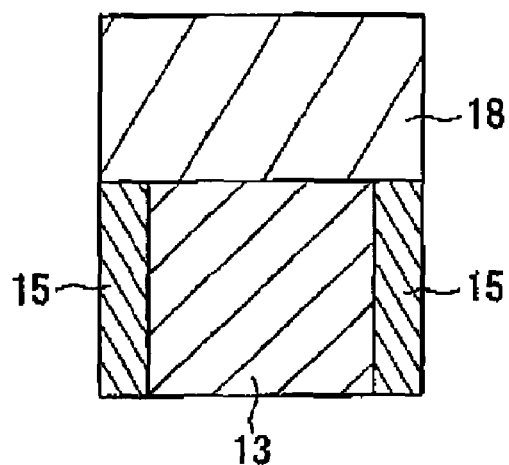
FIGS. 9A and 9B are cross sectional views illustrating another example of a semiconductor device according to the present invention.
Figure 9B:
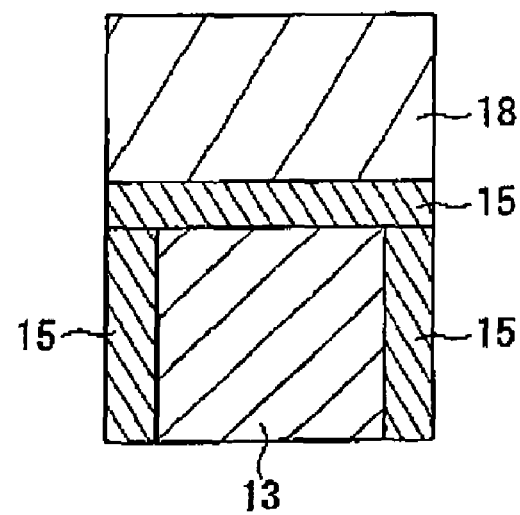

Moreover, the semiconductor device of the present invention may include a thin film layer formed on its side faces in addition to (see FIG. 9B) or instead of (see FIG. 9A) the aforementioned thin film layer formed on the substrate. Furthermore, the semiconductor device may be divided into a plurality of chips. In this case, it is preferable that a thin film layer is formed on their side faces in addition to or instead of the aforementioned thin film layer formed on the substrate surface. The thin film layer formed on their side faces as described above can prevent impurities such as, for example, alkali metal from diffusing into the Group-III-element nitride crystal layer from the side faces of the chips exposed by the division.

Preferably, the semiconductor device of the present invention is a laser diode, a light emitting diode, or a field effect transistor (FET).

An example of the method of manufacturing a semiconductor device according to the present invention is described with reference to FIGS. 2A to 2D. In FIGS. 2A to 2D, parts that are identical to those shown in FIGS. 1A to 1C are indicated with identical numerals.

Figure 2A:
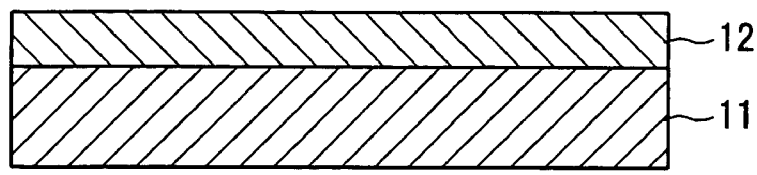
FIGS. 2A to 2D are drawings showing steps of an example of the method of manufacturing a semiconductor device according to the present invention.

First, as shown in FIG. 2A, a seed layer 12 that is expressed by a composition formula of $Al_uGa_vIn_{1-u-v}N$ (where $0 \leq u \leq 1$, $0 \leq v \leq 1$, and $u+v \leq 1$) is formed on a support substrate 11 such as a sapphire substrate. The seed layer 12 serves as seed crystals that are preferably, for example, GaN crystals or crystals that are expressed by a formula of $Al_uGa_{1-u}N$ (where $0 \leq u \leq 1$). The seed layer 12 can be formed by, for example, the MOCVD method, the MBE method, or the HVPE method. The support substrate 11 can be a GaAs substrate whose surface is a (111) plane, a Si substrate whose surface is a (111) plane, a sapphire substrate whose surface is a (0001) plane, or a SiC substrate whose surface is a (0001) plane. In addition, another semiconductor layer may be included between the support substrate 11 and the seed layer 12.

Figure 2B:
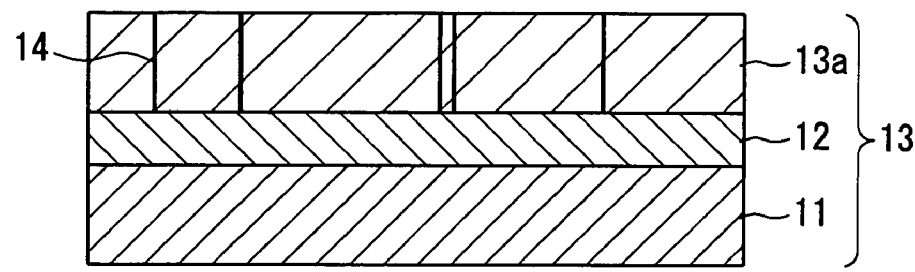

Next, as shown in FIG. 2B, in an atmosphere (preferably a pressurized atmosphere of 100 atm ($100 \times 1.013 \times 10^5$ Pa) or lower) including nitrogen, the seed layer 12 is brought into contact with a melt containing nitrogen, a Group III element, and at least one of alkali metal and alkaline-earth metal, and thereby LPE-GaN 13a is grown on the seed layer 12. In this case, the Group-III-element nitride crystal substrate 13 consists of the support substrate 11, the seed layer 12, and the LPE-GaN 13a. After the formation of the LPE-GaN 13a, the support substrate 11 may be removed. The removal can relax the distortions caused in the LPE-GaN 13a. Examples of the removal method include a laser lift-off method, grinding, and polishing.

Examples of the Group III element include Ga, Al, and In. Among them, Ga and Al are preferable. Usually, alkali metal and alkaline-earth metal serve as a flux. Examples of the alkali metal include Na, Li, K, Rb, Cs, and Fr while examples of the alkaline-earth metal include Ca, Mg, Sr, Be, and Ba. At least one of them, i.e. one or a mixture of them can be used. The atmosphere including nitrogen can be, for example, a nitrogen-containing gas atmosphere including at least one of nitrogen gas and ammonia gas.

The melt can be prepared by, for instance, placing materials in a crucible and then heating them. After the preparation of the melt, the melt is brought into a supersaturation state to allow Group-III-element nitride crystals to grow. The melting of the materials and the crystal growth can be carried out, for instance, at a temperature of about 700° C. to 1100° C. under a pressure of about 1 atm ($1 \times 1.013 \times 10^5$ Pa) to 50 atm ($50 \times 1.013 \times 10^5$ Pa). This method can provide Group-III-element nitride crystals that are expressed by a composition formula of $Al_xGa_yIn_{1-x-y}N$ (where $0 \leq x \leq 1$, $0 \leq y \leq 1$, and $x+y \leq 1$), for example, GaN crystals or crystals that are expressed by a formula of $Al_xGa_{1-x}N$ (where $0 \leq x \leq 1$).

Figure 2C:
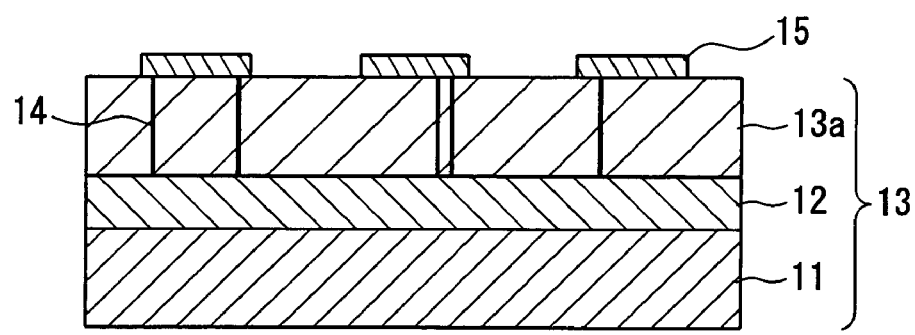

As shown in FIG. 2C, some threading dislocations 14 may be present in the LPE-GaN 13a grown from a liquid phase. Especially, in the case of selective growth, the threading dislocations 14 (for instance, screw dislocations or edge dislocations) caused to extend in the direction of the substrate thickness from the seed layer formed selectively may be present. There is a possibility that the flux component and various other impurities are present in the regions where the threading dislocations 14 have been caused. Hence, a thin film layer 15 made of, for instance, silicon nitride is formed on the regions of the LPE-GaN 13a grown from a liquid phase where the threading dislocations 14 are present. This can prevent, for instance, sodium metal of the LPE-GaN 13a from diffusing. This thin film layer 15 can be formed by, for example, the ECR sputter method.

Figure 2D:
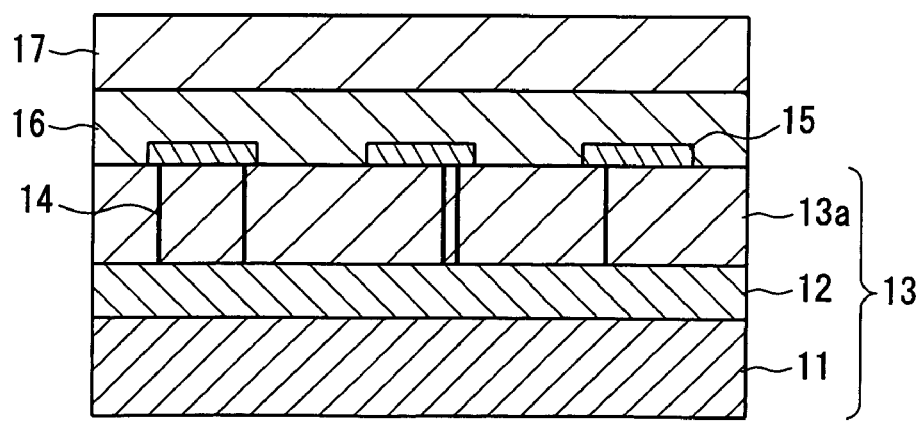

Subsequently, as shown in FIG. 2D, a GaN layer 16 and an AlGaN layer 17 are formed by, for example, the MOCVD method. Thus a device structure such as a semiconductor laser, a light emitting diode, or a high frequency device can be formed. This method can provide a highly reliable semiconductor device.

A GaN substrate may be used as the Group-III-element nitride crystal substrate 13 and a silicon nitride layer (with a thickness of, for instance, 3 nm) or an AN layer (with a thickness of, for instance, 100 nm) may be formed thereon as the thin film layer 15 by the ECR sputter method or the MOCVD method, respectively. In the case of forming the aluminum nitride layer, it is preferable that the low pressure MOCVD method is used to form it. Furthermore, trimethylgallium (TMG) and $NH_3$ are supplied onto the substrate that has been heated to a temperature of about 1020° C. to 1100° C. and thereby n-type GaN crystals can be formed on the thin film layer 15. The formation of a device structure such as a semiconductor laser, a light emitting diode, or a high frequency device on the n-type GaN crystals allows a highly reliable semiconductor device to be provided. As described above, when the silicon nitride layer or the aluminum nitride layer is formed as the thin film layer, impurities such as sodium that are present in the Group-III-element nitride crystal substrate 13 can be prevented from diffusing into the crystal layer 16.

Hereinafter, the present invention is described further in detail using examples. In the following examples, the descriptions are directed to the production of a Group-III-element nitride semiconductor device using GaN crystals. However, Group-III-element nitride crystals that are expressed by a composition formula of $Al_xGa_yIn_{1-x-y}N$ (where $0 \leq x \leq 1$, $0 \leq y \leq 1$, and $x+y \leq 1$) such as $Al_xGa_{1-x}N$ and AlN also can be formed by the same method.

EXAMPLE 1

Example 1 is directed to an example of producing a semiconductor device using Group-III-element nitride crystals that are grown by the liquid phase epitaxy method on a seed layer formed selectively.

Figure 3A:
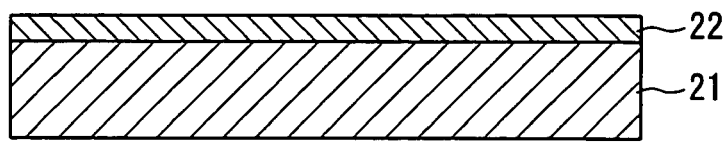
FIGS. 3A to 3E are drawings showing steps of another example of the method of manufacturing a semiconductor device according to the present invention.

First, as shown in FIG. 3A, a support substrate 21 made of sapphire is heated to a temperature of about 1020° C. to 1100° C. and then trimethylgallium (TMG) and $NH_3$ are supplied onto the substrate. Thus, a GaN semiconductor seed layer 22 is formed.

Figure 3B:
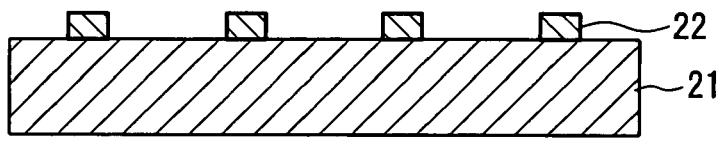

Next, a resist pattern is formed on the surface of the semiconductor seed layer 22 by photolithography. Subsequently, as shown in FIG. 3B, the semiconductor seed layer 22 is patterned by dry etching using $Cl_2$ gas. The dry etching can be carried out using a reactive dry etching (RIE) apparatus of an inductive coupling type.

Figure 3C:
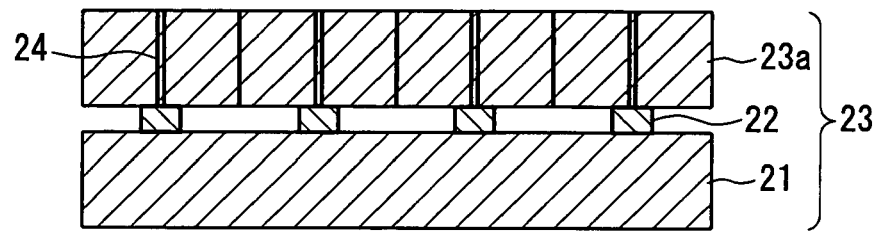

Subsequently, the resist pattern is removed and thus the semiconductor seed layer 22 is patterned. In addition, masks may be formed on the side faces of the semiconductor seed layer 22 and the surface of the support substrate 21. The surface of the semiconductor seed layer 22 then is brought into contact with a melt including Ga, Na, and nitrogen in a nitrogen atmosphere (preferably a pressurized atmosphere of 100 atm ($100 \times 1.013 \times 10^5$ Pa) or lower). The melt is maintained in the supersaturation state and thereby, as shown in FIG. 3C, LPE-GaN 23a is grown selectively on the semiconductor seed layer 22. In this case, the Group-III-element nitride crystal substrate 23 consists of the support substrate 21, the semiconductor seed layer 22, and the LPE-GaN 23a.

Figure 4:
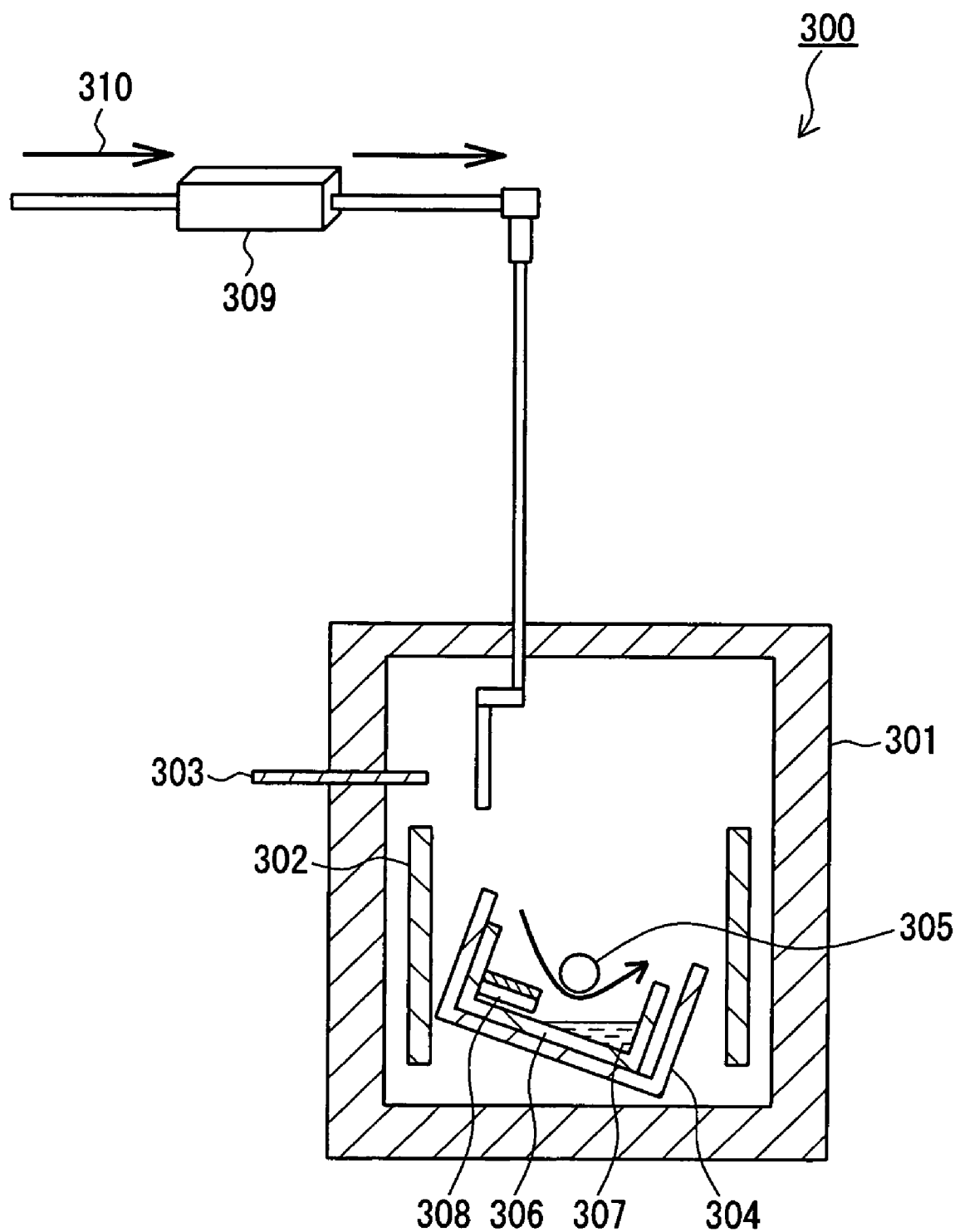
FIG. 4 is a drawing showing the configuration of an example of the manufacturing apparatus that is used for the method of manufacturing a semiconductor device according to the present invention.

FIG. 4 shows an example of the rocking-type LPE apparatus that is used for producing the Group-III-element nitride crystals. This rocking-type LPE apparatus 300 includes a growth furnace 301 that is made of stainless steel and can resist a pressure of 50 atm ($50 \times 1.013 \times 10^5$ Pa). The growth furnace 301 includes a heater 302 and a thermocouple 303 disposed therein. A crucible holding member 304 is disposed inside the growth furnace 301. A mechanism that rotates about a rotary shaft 305 is attached to the crucible holding member 304. A crucible 306 made of boron nitride (BN) or alumina ($Al_2O_3$) is attached to the inner side of the crucible holding member 304. A melt 307 and seed crystals 308 are placed inside the crucible 306. With the rocking of the crucible holding member 304, the melt present inside the crucible 306 moves from side to side and thereby the melt can be stirred. The ambient pressure is regulated by a flow regulator 309. Nitrogen gas or a mixed gas of ammonia gas ($NH_3$ gas) and nitrogen gas, which is a raw material gas, is supplied from a raw material gas tank (not shown in FIG. 4) and is sent into the growth furnace 301 after impurities are removed therefrom in a gas purifying unit.

An example of crystal growth that is carried out using this apparatus is described below.

(1) First, predetermined amounts of Ga and Na to serve as a flux are weighed and then are placed inside the crucible. Preferably, the Ga to be used herein is one with a purity of at least 99.9999% (six nines) while the Na to be used herein is purified Na. Na may be purified as follows: Na is heated to melt in a glove box, the inside of which had been subjected to He ($N_2$, Ar, Ne, or Xe also may be used instead thereof) substitution, and then for example, oxides emerging on the surface layer are removed. Alternatively, Na may be purified by a zone refining method. In the zone refining method, Na is melted and solidified repeatedly in a tube, and thereby impurities are deposited and then removed. Thus, the purity of Na can be increased.

(2) In order to melt the raw material placed inside the crucible, the temperature inside the electric furnace is raised to 800° C. In this stage, the seed crystal substrate is not in the melt as shown in the drawing. In order to mix Ga and Na, the crucible is rocked to a degree that does not allow the melt to adhere to the seed crystal substrate. In order to prevent GaN from being oxidized, the ambient gas is preferably, for example, nitrogen gas.

(3) Next, the crucible is rotated about the rotary shaft and the seed crystal substrate is put into the melt to allow crystals to start growing.

(4) In order to stir the melt, the crucible is rocked during the crystal growth at a speed that allows it to complete one cycle of rocking per minute. During the growth, the seed crystal substrate is allowed to be in the melt. While the crucible is maintained at 800° C. and the pressure is kept at 40 atm ($40 \times 1.013 \times 10^5$ Pa), LPE growth is carried out for 10 hours, for example.

(5) After the growing process is completed, the crucible is rotated as shown in the drawing, the substrate is taken out of the melt, and then the temperature of the melt is lowered.

When GaN crystals were made to grow by the above-mentioned method, crystals started growing from the semiconductor seed layer 2 and then threading dislocations extending from the semiconductor seed layer toward the substrate surface were observed. However, portions that grew in the lateral direction from the semiconductor seed layer were excellent GaN single crystals. In this connection, dislocations also were observed in the portions where GaN crystals that grew in the lateral direction met each other.

With this method, similar effects to those obtained through the use of the Na flux can be obtained even when using a Li, K, Ca, Sr, or Ba flux or a mixed flux of alkali metal and alkaline-earth metal. For instance, when using a mixed flux of Na and Ca, the Ca added so as to account for about 10% of the whole allows crystals to grow under lower pressure.

Figure 3D:
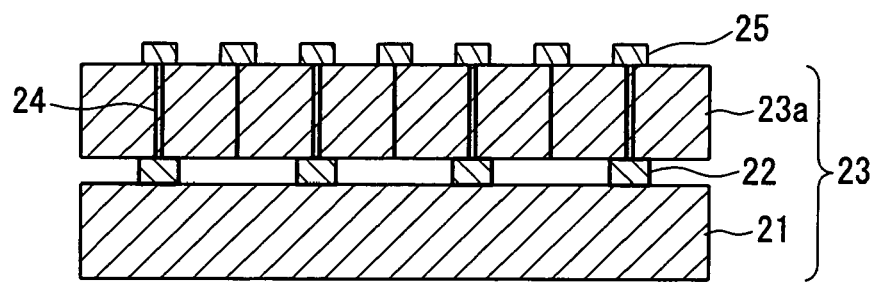

Next, as shown in FIG. 3D, a thin film layer 25 of silicon nitride is formed on the substrate 23 (the LPE-GaN 23a) by, for example, the ECR sputter method. The surface of the substrate 23 may be flattened through mechanical processing (polishing) and mechanochemical polishing. As described above, threading dislocations 24 that extended from the semiconductor seed layer 22 toward the substrate surface were observed in the LPE-GaN 23a. In addition, dislocations also were observed in the portions where GaN crystals that grew in the lateral direction met each other. Impurity analysis was carried out by the SIMS. As a result, many impurities such as, for instance, sodium were present in the threading dislocation 24 regions. A thin film layer 25 of silicon nitride was formed on the regions of the substrate 23 where the threading dislocations 24 were present. The thin film layer may be made of aluminum nitride, aluminum gallium nitride, silicon carbide, germanium nitride, or diamond-like carbon instead of silicon nitride.

Figure 3E:
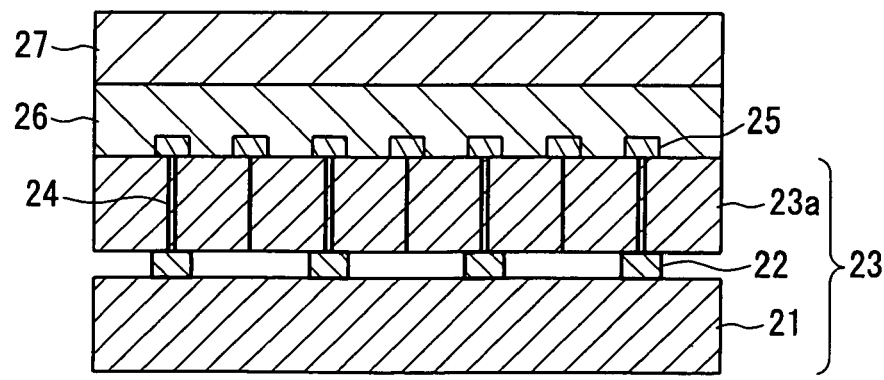

Subsequently, as shown in FIG. 3E, a GaN layer 26 and an AlGaN layer 27 were formed by, for example, the MOCVD method. Thus, a semiconductor device of the present invention was produced. When a semiconductor device is produced using a GaN substrate formed by the alkali metal flux method, the formation of the thin film layer 25 described above can prevent alkali metal and the like from diffusing into a light emitting part of a semiconductor laser or a light emitting diode, or respective electrode parts of an FET. Accordingly, the device properties can be improved.

The above description was directed to the GaN substrate that was produced through the LPE growth of GaN crystals using a substrate including a semiconductor seed layer. However, another GaN substrate may be used, which is obtained by slicing large crystals grown in bulk using GaN crystals as seeds. The use of a template allows GaN crystals including regions with no dislocations to be formed selectively and further easily. Since the crystals thus grown have not been grown selectively, impurities such as alkali metal or alkaline-earth metal may be contained in the dislocations that occur at random. Hence, the thin film layer formed on the whole substrate surface can prevent the impurities from diffusing.

Figure 5:
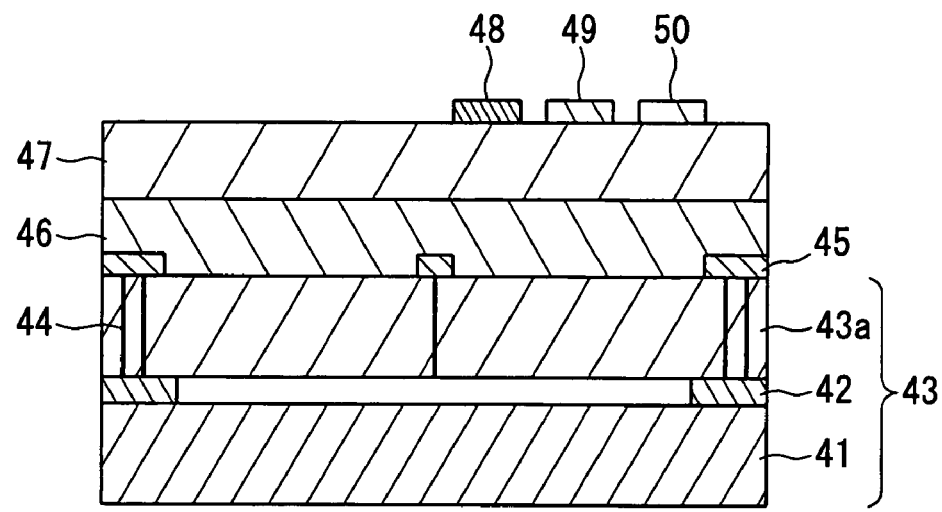
FIG. 5 is a cross-sectional view showing the configuration of another example of the semiconductor device according to the present invention.

Next, a method of producing an FET is described with reference to FIG. 5. A Group-III-element nitride crystal substrate 43 includes a support substrate 41, a seed layer 42, and an LPE-GaN 43a. The LPE-GaN 43a that is obtained through the liquid phase epitaxy as described earlier has an electrical resistance of, for instance, at least $10^{10}$ Ω and therefore has characteristics similar to those of an insulator. A silicon nitride layer was formed as a thin film layer 45 on the regions where threading dislocations 44 were present in the LPE-GaN 43a. Next, a GaN layer 46 and an AlGaN layer 47 were formed by the MOCVD method. Furthermore, a source electrode 48, a Schottky gate electrode 49, and a drain electrode 50 were formed thereon. Voltage is applied to the gate electrode 49 and thereby the concentration of two-dimensional electron gas that is generated at the interface between the GaN layer 46 and the AlGaN layer 47 is controlled. Thus the operation as a transistor is carried out.

As described above, a thin film layer is formed in the FET that is produced by the method of the present invention. Thus, it is possible to obtain a FET that has a high insulation property and an excellent high frequency property and allows the leakage current that is caused during the operation of the transistor to be reduced.

EXAMPLE 2

Figure 6:
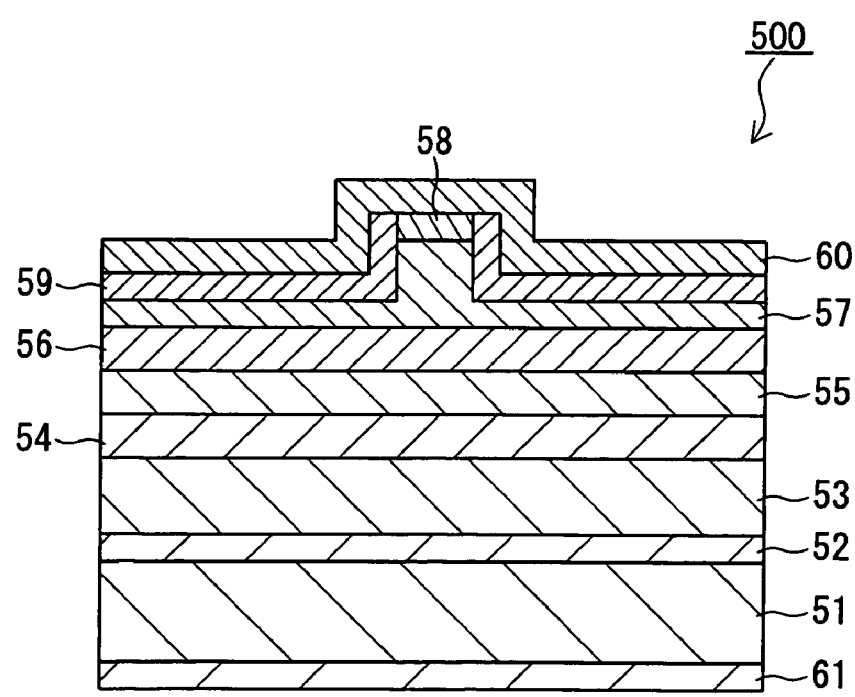
FIG. 6 is a cross-sectional view showing the configuration of still another example of the semiconductor device according to the present invention.

An example of the configuration of a semiconductor laser is shown in FIG. 6. As shown in FIG. 6, first, a contact layer 52 of n-type GaN doped with Si to have a carrier density of $5 \times 10^{18}$ cm$^{-3}$ or lower was formed on a GaN substrate 51 having a thin film layer (not shown in FIG. 6). In GaN-based crystals (crystals containing Ga and N), when Si is added thereto as an impurity, holes present in Ga increase in number. Since the holes present in Ga diffuse easily, they have harmful effects in terms of, for example, lifetime when a device is formed thereon. Hence, the doping amount may be controlled so that the contact layer has a carrier density of $1 \times 10^{19}$ cm$^{-3}$ or lower, preferably $3 \times 10^{18}$ cm$^{-3}$ or lower.

Next, a cladding layer 53 of n-type Al$_{0.07}$Ga$_{0.93}$N and a light guiding layer 54 of n-type GaN were formed sequentially on the contact layer 52. Subsequently, a multiple quantum well (MQW) composed of a well layer (with a thickness of about 3 nm) made of Ga$_{0.8}$In$_{0.2}$N and a barrier layer (with a thickness of about 6 nm) made of GaN was formed as an active layer 55. Thereafter, a light guiding layer 56 of p-type GaN, a cladding layer 57 of p-type Al$_{0.07}$Ga$_{0.93}$N, and a contact layer 58 of p-type GaN were formed sequentially. These layers can be formed by well-known methods. The semiconductor laser 500 is of a double-hetero junction type. The energy gap of the well layer containing indium in the MQW active layer 55 is smaller than those of the n-type and p-type cladding layers containing aluminum. On the other hand, the highest optical refractive index is obtained in the well layer of the active layer 55, while the light guiding layer 54 and the cladding layer 53 have optical refractive indices that decrease in this order.

An insulating film 59 forming a current injection region having a width of about 2 μm was formed in the part of the contact layer 58. A ridge part to serve as a current constriction part was formed in the p-type cladding layer 57 and the p-type contact layer 58.

A p-side electrode 60 that was in ohmic contact with the contact layer 58 was formed on the side of the p-type contact layer 58. An n-side electrode 61 that was in ohmic contact with the contact layer 52 was formed on the side of the n-type contact layer 52.

EXAMPLE 3

Figure 7:
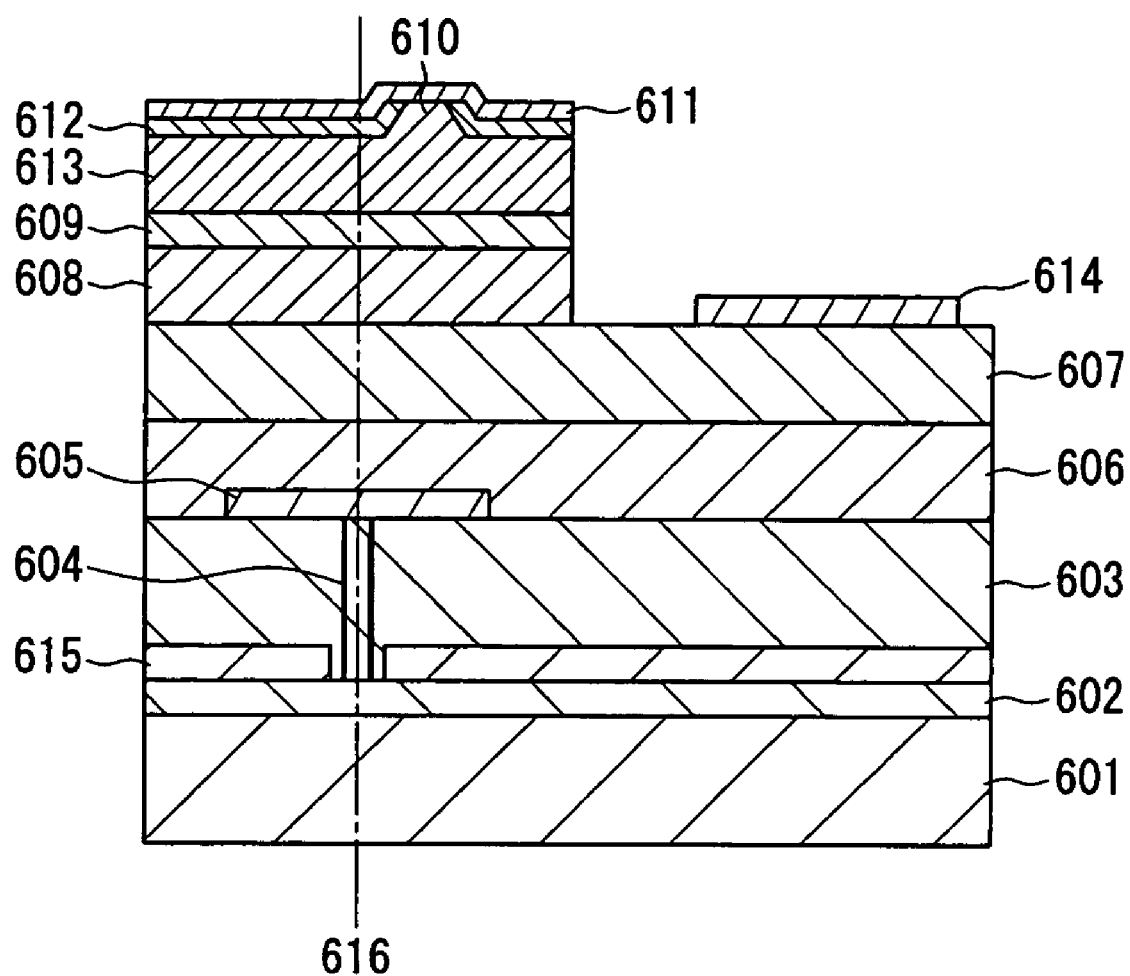
FIG. 7 is a cross-sectional view showing the configuration of yet another example of the semiconductor device according to the present invention.

Another configuration of the semiconductor laser is shown in FIG. 7. In FIG. 7, numeral 601 indicates a support substrate, numeral 602 a seed layer, numeral 603 an LPE-GaN layer, numeral 604 threading dislocations, numeral 605 a thin film layer, numeral 606 a GaN layer, numeral 607 an n-type GaN layer, numeral 608 an n-type cladding layer, numeral 609 an active layer, numeral 610 a ridge part, numeral 611 a p-side electrode, numeral 612 an insulating film, numeral 614 an n-side electrode, numeral 615 a selective growth film, and numeral 616 a symmetry axis. As shown in FIG. 7, the ridge region 610 to serve as a laser oscillation part is located above the thin film layer 605 but is formed so as not to align with the symmetry axis 616 of the thin film layer 605. The epitaxial film (i.e. the GaN layer 606), which grows from a vapor phase on the thin film layer 605, grows from the regions where the thin film layer 605 is not located thereon and portions of the epitaxial film grown from the regions dock with each other approximately on the symmetry axis 616. Hence, there is a possibility that edge dislocations remain in the portion located on the symmetry axis 616. It therefore is preferable that the ridge region 610 is formed so as not to align with the symmetry axis.

The semiconductor laser having the configuration described above was subjected to a device evaluation. When a predetermined forward voltage was applied between the p-side electrode and the n-side electrode of the semiconductor laser obtained above, positive holes and electrons were injected into the MQW active layer from the p-side electrode and the n-side electrode, respectively. The positive holes and electrons thus injected were recombined with each other in the MQW active layer to produce optical gain, and thereby the semiconductor laser generated oscillation with an emission wavelength of 404 nm.

The Group-III-element nitride crystal substrate that can be used for the semiconductor device of the present invention is not limited to the GaN single crystal substrate mentioned above. Preferably, a substrate is provided that has a low absorptance at a wavelength that is used in an optical device to be produced on the substrate. Accordingly, it is preferable that Al$_x$Ga$_{1-x}$N (where $0 \leq x \leq 1$) single crystals that contain a large amount of Al and have low absorptivity with respect to light with short wavelengths are used as the substrate for a semiconductor laser or a light emitting diode that emits light in the ultraviolet region.

EXAMPLE 4

Figure 8A:
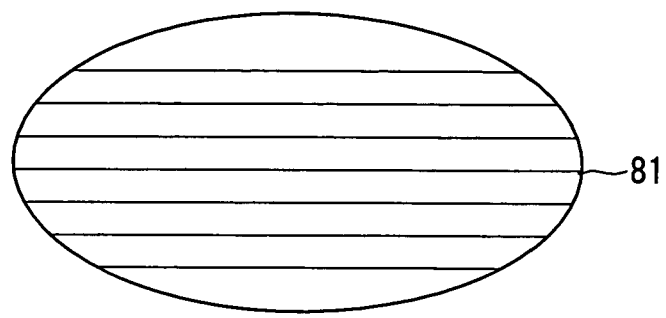
FIGS. 8A to 8C are drawings showing steps of a further example of the method of manufacturing a semiconductor device according to the present invention.
Figure 8A:

As shown in FIG. 8A, a wafer 81 for a semiconductor laser is produced by epitaxially growing crystals on a GaN substrate produced through liquid phase epitaxy using sodium as a flux, making a laser structure, and then forming electrodes. This then is processed into a bar as shown in FIG.

Figure 8B:
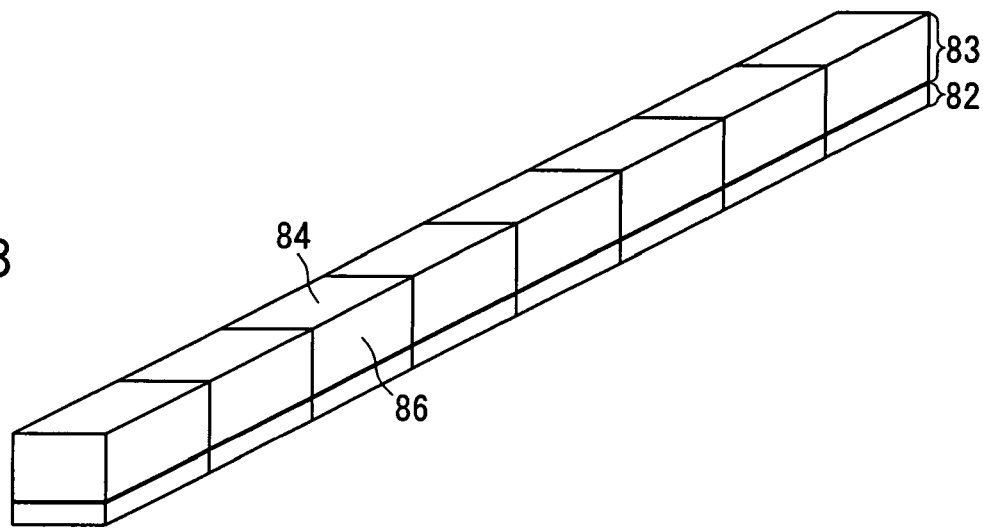
Figure 8B:
Figure 8C:
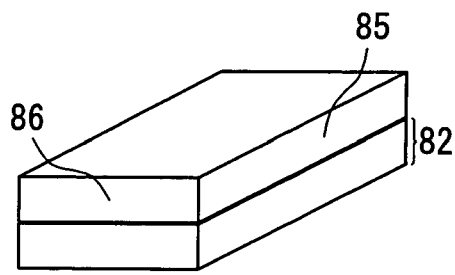

8B. A coating is formed on the light emitting plane of the bar to control the reflectance of the laser resonator, and is formed to protect the end face and to prevent sodium from diffusing. This coating film includes at least a silicon nitride layer and thereby prevents sodium from diffusing. In the state shown in FIG. 8B, a device structure 83 may be formed on an LPE-GaN substrate 82 and further an electrode 84 may be formed. Subsequently, as shown in FIG. 8C, the bar in which the end face of its light emitting part has been coated is divided into chips. The side faces (dividing planes) 85 of the divided chips may include partially sodium impurity regions (not shown in FIG. 8C) formed due to dislocations or defects. Hence, in order to prevent sodium from diffusing, it is necessary to form a thin film layer made of, for instance, silicon nitride on the dividing planes. This allows leakage current caused due to the diffusion of sodium to be reduced considerably and thereby a stable device operation can be achieved. In FIG. 8C, numeral 86 indicates the light-emitting plane.

In this example, silicon nitride was used for the thin film layer. However, for instance, aluminum nitride, silicon carbide, and diamond-like carbon also can be used effectively since they have a high barrier property with respect to sodium.

The present invention can be used for various semiconductor devices such as, for example, a laser diode, a light emitting diode, and an FET.

Specific embodiments and examples described in the detailed description of the present invention are intended merely to clarify the technical details of the present invention. The present invention should not be limited to such specific examples to be understood narrowly. The present invention can be changed variously to be carried out within the spirit of the present invention and the range of the following claims.

What is claimed is:

1. A Group-III-element nitride semiconductor device, comprising:
   a Group-III-element nitride crystal substrate;
   a Group-III-element nitride crystal layer stacked on the Group-III-element nitride crystal substrate; and
   a thin film layer,
   wherein the Group-III-element nitride crystal substrate is produced by allowing nitrogen of nitrogen-containing gas and a Group III element to react with each other to crystallize in a melt containing at least one of alkali metal and alkaline-earth metal,
   the Group-III-element nitride crystal substrate includes a threading dislocation,
   at least one of alkali metal and alkaline-earth metal is present as impurities in a region where the threading dislocation is present,
   the thin film layer is formed on the Group-III-element nitride crystal substrate and has a lower diffusion coefficient than that of the Group-III-element nitride crystal substrate with respect to impurities contained in the Group-III-element nitride crystal substrate, and
   wherein the impurities are at least one of Na and Li.

2. The semiconductor device according to claim 1, wherein the thin film layer is formed on the region where the threading dislocation is present in the Group-III-element nitride crystal substrate.

3. The semiconductor device according to claim 1, wherein the thin film layer is formed on the whole surface of the Group-III-element nitride crystal substrate.

4. The semiconductor device according to claim 1, wherein the thin film layer is formed of silicon nitride (SiN).

5. The semiconductor device according to claim 4, wherein the thin film layer has a thickness of 5 nm or less.

6. The semiconductor device according to claim 4, wherein the thin film layer has a thickness of 3 nm or less.

7. The semiconductor device according to claim 1, wherein the thin film layer is formed of at least one selected from the group consisting of aluminum nitride (AlN), aluminum gallium nitride ($Al_xGa_{1-x}N$ (where $0 \leq x \leq 1$)), and silicon carbide (SiC).

8. The semiconductor device according to claim 1, wherein the thin film layer is formed between the Group-III-element nitride crystal substrate and the Group-III-element nitride crystal layer.

9. The semiconductor device according to claim 8, further comprising a second Group-III-element nitride crystal layer formed between the Group-III-element nitride crystal substrate and the thin film layer.

10. The semiconductor device according to claim 1, wherein the Group-III-element nitride crystal layer is formed through vapor phase epitaxy.

11. The semiconductor device according to claim 1, wherein the alkali metal contained in the melt is at least one selected from the group consisting of Na, Li, K, Rb, Cs, and Fr.

12. The semiconductor device according to claim 1, wherein the alkali metal contained in the melt is at least one of Na and Li.

13. The semiconductor device according to claim 1, wherein the alkaline-earth metal contained in the melt is at least one of Ca and Mg.

14. The semiconductor device according to claim 1, wherein the Group III element is at least one selected from the group consisting of Ga, Al, and In.

15. The semiconductor device according to claim 1, wherein the melt contains at least one of Na and Li, the Group-III-element nitride crystal substrate is a GaN substrate, and the thin film layer is formed of at least one selected from the group consisting of aluminum nitride (AlN), aluminum gallium nitride ($Al_xGa_{1-x}N$ (where $0 \leq x \leq 1$)), and silicon carbide (SiC).

16. The semiconductor device according to claim 15, wherein the Group-III-element nitride crystal substrate contains impurities of at least one of Na and Li.

17. The semiconductor device according to claim 1, wherein the melt contains Ca and one selected from the group consisting of Li, Na, and Sn, the Group-III-element nitride crystal substrate is an AlN substrate, and the thin film layer is made of diamond.

18. The semiconductor device according to claim 17, wherein the Group-III-element nitride crystal substrate contains impurities of at least one of Na and Li.

19. The semiconductor device according to claim 1, further comprising another thin film layer that is formed on side faces of the semiconductor device in addition to or instead of the thin film layer formed on the Group-III-element nitride crystal substrate.

20. The semiconductor device according to claim 1, wherein the semiconductor device is a laser diode, a light emitting diode, or a field effect transistor.

* * * * *